(12) United States Patent
Olivieri et al.

(10) Patent No.: US 7,936,166 B2
(45) Date of Patent: May 3, 2011

(54) QUARTER CYCLE WAVEFORM DETECTOR

(75) Inventors: Frank Olivieri, Wayne, NJ (US); Walter Kluss, Clifton, NJ (US); Son T. Tran, Hillsdale, NJ (US)

(73) Assignee: Honeywell International Inc., Morristown, NJ (US)

( * ) Notice: Subject to any disclaimer, the term of this patent is extended or adjusted under 35 U.S.C. 154(b) by 259 days.

(21) Appl. No.: 12/429,786

(22) Filed: Apr. 24, 2009

(65) Prior Publication Data

US 2010/0271073 A1 Oct. 28, 2010

(51) Int. Cl.
*G01B 7/14* (2006.01)
(52) U.S. Cl. .................................................. 324/207.18
(58) Field of Classification Search .................. 324/200, 324/207.18
See application file for complete search history.

(56) References Cited

U.S. PATENT DOCUMENTS

| | | | | |
|---|---|---|---|---|
| 3,488,589 A | * | 1/1970 | Kintner | 324/99 R |
| 3,541,417 A | * | 11/1970 | Frank, Jr | 318/571 |
| 3,976,997 A | * | 8/1976 | Hafle | 341/13 |
| 4,297,698 A | * | 10/1981 | Pauwels et al. | 340/870.32 |
| 4,564,823 A | | 1/1986 | Stahler | |
| 4,591,795 A | * | 5/1986 | McCorkle | 327/104 |
| 4,754,220 A | * | 6/1988 | Shimizu et al. | 324/207.18 |
| 4,982,156 A | * | 1/1991 | Lewis et al. | 324/207.18 |
| 5,243,537 A | * | 9/1993 | Neumann | 702/66 |
| 5,399,964 A | * | 3/1995 | Zoller | 324/103 P |
| 5,987,392 A | | 11/1999 | Tucker et al. | |
| 6,621,426 B1 | | 9/2003 | van Nguyen | |
| 7,716,001 B2 | * | 5/2010 | Lee et al. | 702/107 |
| 2007/0024854 A1 | * | 2/2007 | Jungwirth | 356/450 |
| 2008/0122509 A1 | * | 5/2008 | Takeuchi | 327/163 |
| 2008/0291973 A1 | * | 11/2008 | Azakkour et al. | 375/130 |

* cited by examiner

*Primary Examiner* — Patrick J Assouad
*Assistant Examiner* — Vincent P Spinella-Mamo
(74) *Attorney, Agent, or Firm* — Fogg & Powers LLC

(57) ABSTRACT

A method for extracting peak information from an amplitude varying sinusoidal waveform output from a sensor is provided. The method includes gating a counter with a keying signal having a keying-signal period generated by a sinusoidal waveform associated with the amplitude varying sinusoidal waveform, receiving high frequency clock signals at the gated counter during keying-signal periods, wherein a clock-signal period is much less than the keying-signal periods, disabling the counter at the end of each keying-signal period, generating a quarter-count value based on the disabling, and outputting a sample pulse associated with each keying-signal period. If a current-keying-signal period is the same as a last-keying-signal period, the sample pulse is generated at a quarter-wave of the sinusoidal waveform. If the current-keying-signal period differs from the last-keying-signal period, the associated output sample pulses are adjusted to the quarter-wave of the sinusoidal waveform in the next-keying-signal period.

20 Claims, 4 Drawing Sheets

QUARTER CYCLE WAVEFORM DETECTOR

BACKGROUND

Sensors such a synchors, resolvers, linearly variable differential transformers (LVDT), rotary variable differential transformers (RVDT), linear Hall sensors, capacitive position sensors and others are utilized extensively across numerous industries wherever accurate sensing of position is needed. Many avionic applications require very accurate position information to control many of the aircraft surfaces such as flaps, ailerons, and rudders. This position information is fed back to a controller, which drives the surface to the command.

Most of the positioning sensors are magnetic and require AC excitation (sinusoidal waveform) to energize the device. The position information is contained in the amplitude of the sinusoidal waveform output from the sensor. One method of extracting the peak information from the amplitude varying sinusoidal waveform uses a phase locked loops (PLL). This technique relies on adjusting the output of a voltage-controller oscillator (VCO) until it locks in frequency and phase to the input signal. PLL are sensitive to phase delays, which cause circuit instability. In addition, PLLs are inherently noisy due to the VCO running asynchronously with other signals on the board.

Another technique to obtain the amplitude of a sinusoidal waveform from the above mentioned sensors is to either diode rectify and filter the signals or to use phase sensitive demodulators. These circuits use filters to obtain an average over many cycles of the input to arrive at the amplitude. Filters with long time constants are needed to obtain high accuracy. The time delay associated with these filters introduce significant unwanted delays in the overall system.

SUMMARY

The present application relates to a method for extracting peak information from an amplitude varying sinusoidal waveform output from a sensor. The method includes gating a counter with a keying signal having a keying-signal period generated by a sinusoidal waveform associated with the amplitude varying sinusoidal waveform, receiving high frequency clock signals at the gated counter during keying-signal periods, wherein a clock-signal period is much less than the keying-signal periods, disabling the counter at the end of each keying-signal period, generating a quarter-count value based on the disabling, and outputting a sample pulse associated with each keying-signal period. If a current-keying-signal period is the same as a last-keying-signal period, the sample pulse is generated at a quarter-wave of the sinusoidal waveform. If the current-keying-signal period differs from the last-keying-signal period, the associated output sample pulses are adjusted to the quarter-wave of the sinusoidal waveform in the next-keying-signal period.

The details of various embodiments of the claimed invention are set forth in the accompanying drawings and the description below. Other features and advantages will become apparent from the description, the drawings, and the claims.

DRAWINGS

Like reference numbers and designations in the various drawings indicate like elements.

DETAILED DESCRIPTION

The peak detection circuit described herein provides a manner in which the peak of a sinusoidal waveform is precisely captured without the complexity of PLLs and without the extensive delays caused by filtering. Thus, the peak detection circuit described herein avoids the above mentioned problems associated with the PPLs and filters. The peak detection circuit accurately detects the time of occurrence of the half way point of the positive and/or negative portion of a repetitive sinusoidal waveform. Once this time is known, the peak value of the amplitude varying sinusoidal waveform that is output from a sensor is captured and measured in the sensor peak detection circuit described herein. The sign of the voltage is indicative of the polarity of the amplitude varying sinusoidal waveform. The peak detection circuit automatically adjusts for variations in the signal frequency and maintains a fast response time enabling it to be used with low frequency sensor excitations. The peak detection circuit comprised of a counter/register is a totally digital solution, which can be implemented with a low utilization field programmable gate array (FPGA) or complex programmable logic device (CPLD). In many cases, the peak detection circuit can be implemented on existing FPGA or CPLD with no additional circuity. The peak detection circuit described herein is useful when the response time of a prior art phase sensitive demodulator implementation is inadequate for a particular application.

Figure 1:
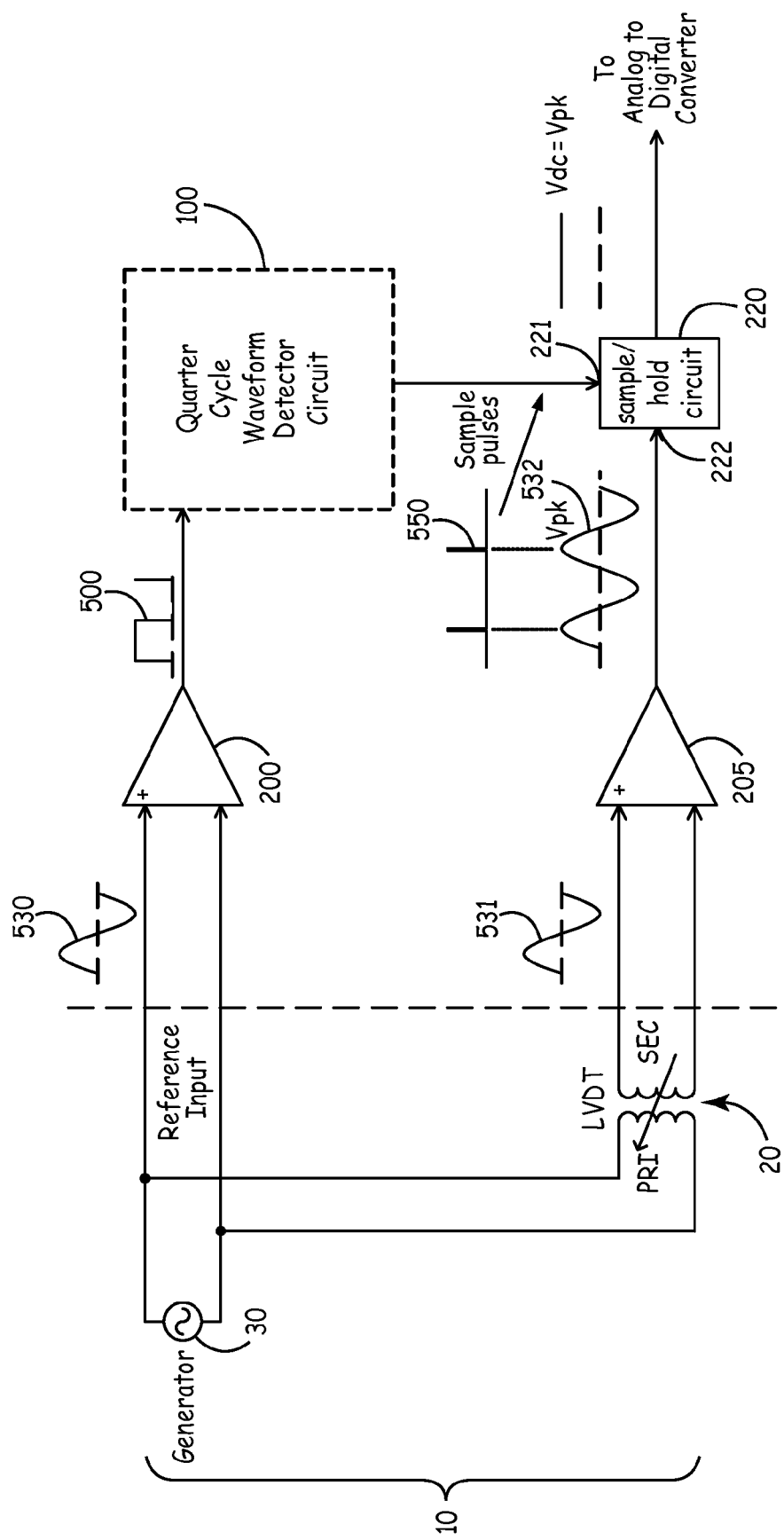
FIG. 1 is a block diagram of one embodiment of a sensor peak detection circuit in accordance with the present invention.

FIG. 1 is a block diagram of one embodiment of a sensor peak detection circuit 10 in accordance with the present invention. The sensor peak detection circuit 10 includes a generator 30, a sensor 20, a differential receiving amplifier 205, a zero crossing detector 200, a quarter cycle waveform detector circuit 100, and a sample/hold circuit 220. The sensor 20 illustrated in FIG. 1 is a linearly variable differential transformer. The sample and hold circuit 220 is used to interface signals to a subsequent system such as an analog-to-digital converter. The sample and hold circuit 220 holds the analog value steady for a short time while the converter or other following system performs some operation that takes a little time.

The generator 30 generates a sinusoidal waveform 530, which is input to the sensor 20 and the zero crossing detector 200. The zero crossing detector 200 receives the sinusoidal waveform 530 from the generator 30 and, responsive to the input of the sinusoidal waveform 530, outputs a keying signal 500 having a keying-signal period 510. The quarter cycle waveform detector circuit 100 receives the keying signal 500 from the zero crossing detector 200. The quarter cycle waveform detector circuit 100 generates and outputs a series of sample pulses 550 to a first input 221 of the sample/hold circuit 220. The sample pulses 550 are correlated to a peak of the sinusoidal waveform 530 when the frequency of the sinusoidal waveform 530 is constant. When the frequency of the sinusoidal waveform 530 changes, the sample pulses 550 are adjusted to be correlated to the peak of the sinusoidal waveform 530 within one cycle of the sinusoidal waveform 530 after the change in frequency.

The sensor 20 receives the sinusoidal waveform 530 from the generator 30 and outputs an amplitude varying sinusoidal waveform 531. The differential receiving amplifier 205 receives the amplitude varying sinusoidal waveform 531 from the sensor 20 and outputs the amplitude varying sinusoidal waveform 532 to a second input 222 of the sample/hold circuit 220. The amplitude varying sinusoidal waveform 532 is correlated with the sinusoidal waveform 530 but varies in amplitude, unlike the sinusoidal waveform 530. The sample/hold circuit 220 receives the sample pulses 550 output from the comparator 140 and receives the amplitude varying sinusoidal waveform 532 from the sensor 20 and outputs a voltage indicative of a polarity and an amplitude of the amplitude varying sinusoidal waveform 531.

In embodiments, the sensor 20 is a synchro, a resolver, a rotary variable differential transformer, a linear Hall sensor, or a capacitive position sensor.

Figure 2:
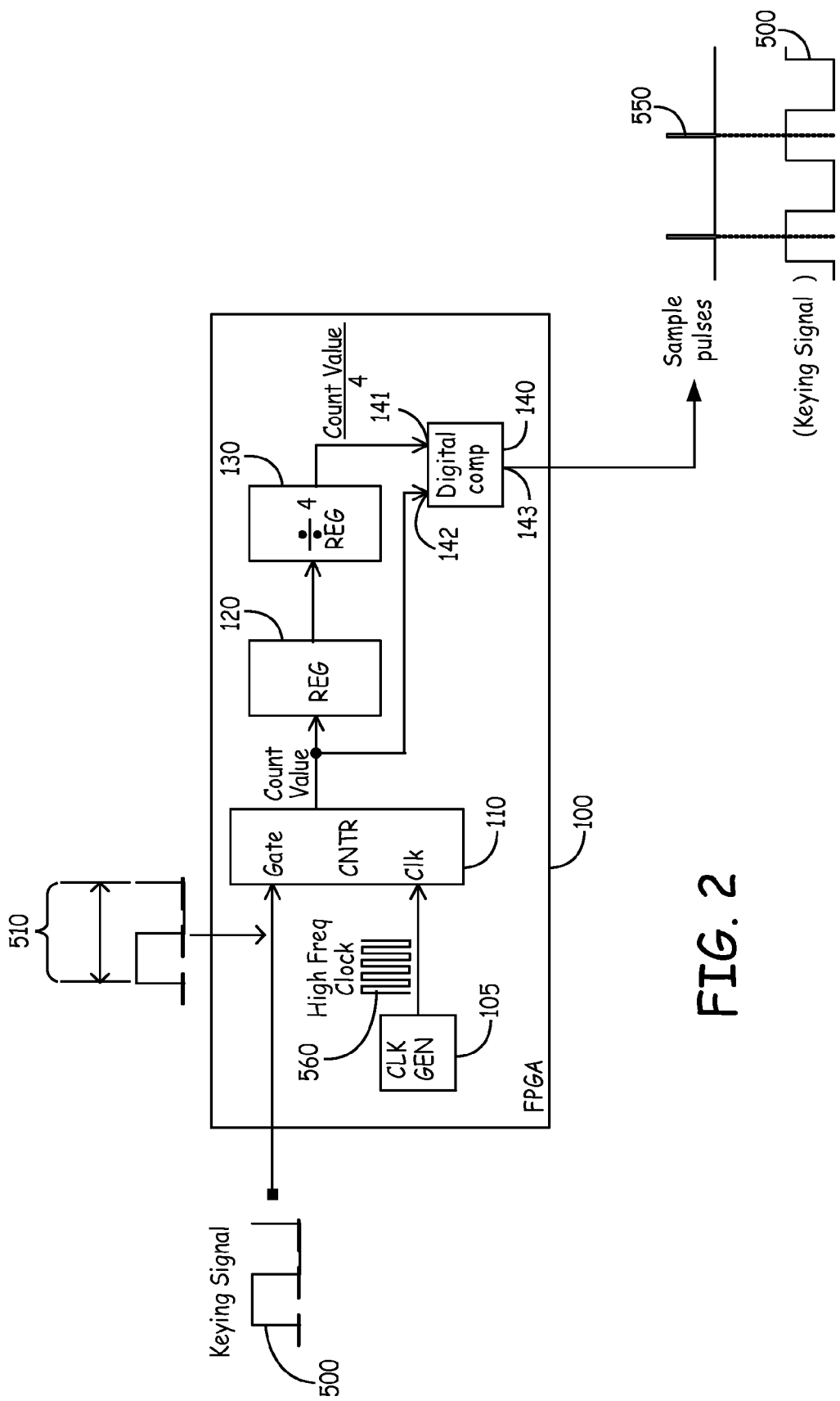
FIG. 2 is a block diagram of an embodiment of a quarter cycle waveform detector circuit in accordance with the present invention.

FIG. 2 is a block diagram of an embodiment of a quarter cycle waveform detector circuit 100 in accordance with the present invention. The quarter cycle waveform detector circuit 100 includes a counter 110, a clock generator 105, a first register 130, a second register 120, and a comparator 140.

Figure 3:
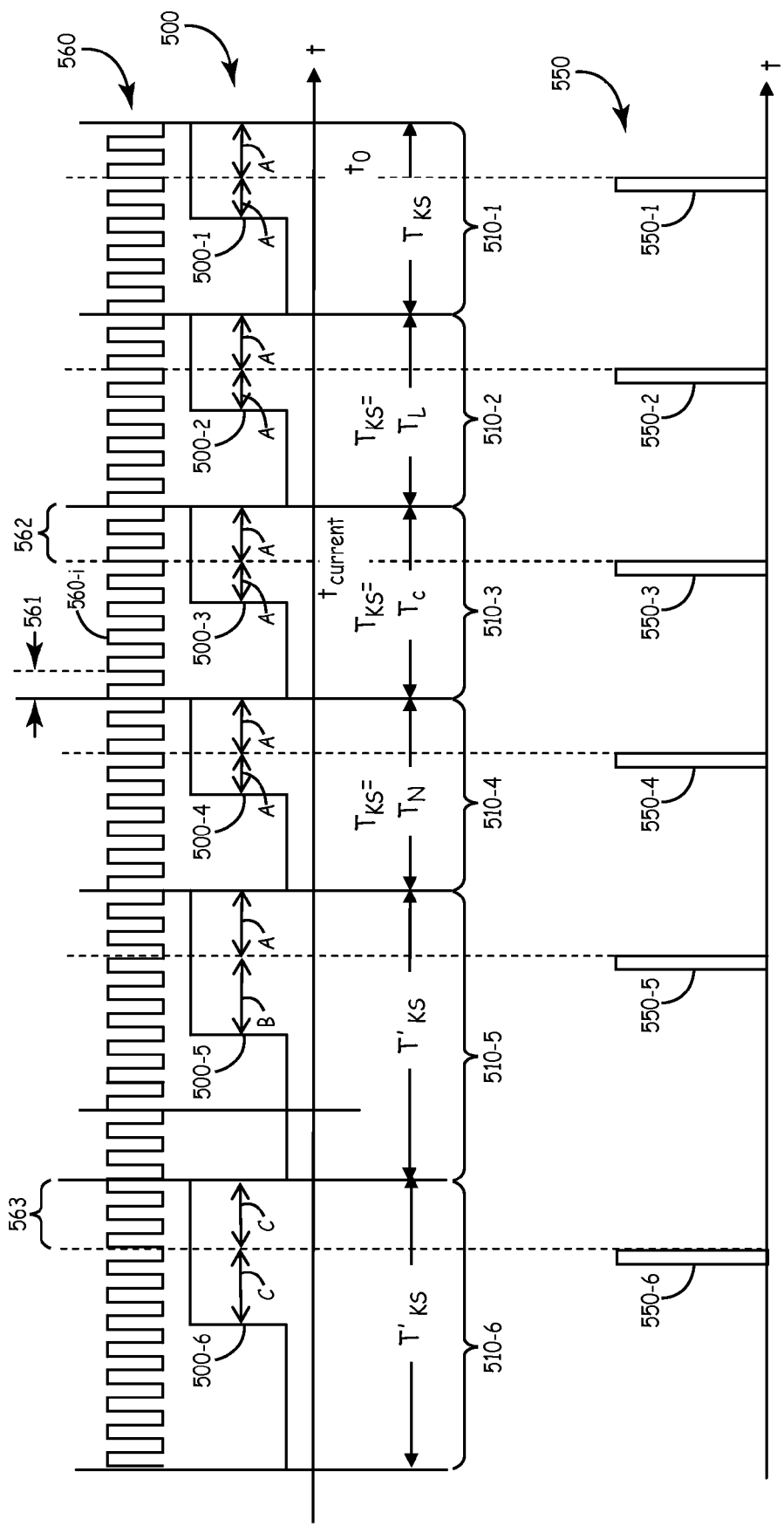
FIG. 3 is a block diagram of keying signals temporally aligned with associated sample pulses and high frequency clock signals in accordance with the present invention.

FIG. 3 is a block diagram of keying signals 500 temporally aligned with associated sample pulses 550 and high frequency clock signals 560 in accordance with the present invention. The keying-signal period of the $i^{th}$ keying signal 500 is indicated generally as 510-$i$. As shown in FIG. 3, the keying-signal periods 510(1-4) have the same duration $T_{ks}$, while the keying-signal periods 510(5-6) have a different time duration $T'_{ks}$ that is longer than the time duration $T_{ks}$ of the keying-signal periods 510(1-4). The keying signal 500-1 is generated before the keying signal 500-2; the keying signal 500-2 is generated before the keying signal 500-3; etc. The period 561 of the high frequency clock signals 560 is much less than the period 510-$i$ of the $i^{th}$ keying signal 500-$i$. The period 561 of the high frequency clock signals 560 is not shown to scale in FIG. 3. In a typical embodiment, the period 61 is about one hundredth (1/100) of the period 510.

An initial time is indicated as $t_0$ in the keying-signal period 510-1. A current time $t_{current}$ is indicated in the keying-signal period 510-3 (with a duration of $T_C$). In relationship to the current-keying-signal period 510-3, which includes the current time $t_{current}$, the keying-signal period 510-2 is the last-keying-signal period (with a duration of $T_L$) and the keying-signal period 510-4 is the next-keying-signal period (with a duration $T_N$). As shown in FIG. 3, $T_C=T_L=T_N$. The last-keying-signal period 510-2 is also referred to herein as the "first-keying-signal period 510-2." The current-keying-signal period 510-3 is also referred to herein as the "second-keying-signal period 510-3." The next-keying-signal period 510-4 is also referred to herein as the "third-keying-signal period 510-4."

Figure 4:
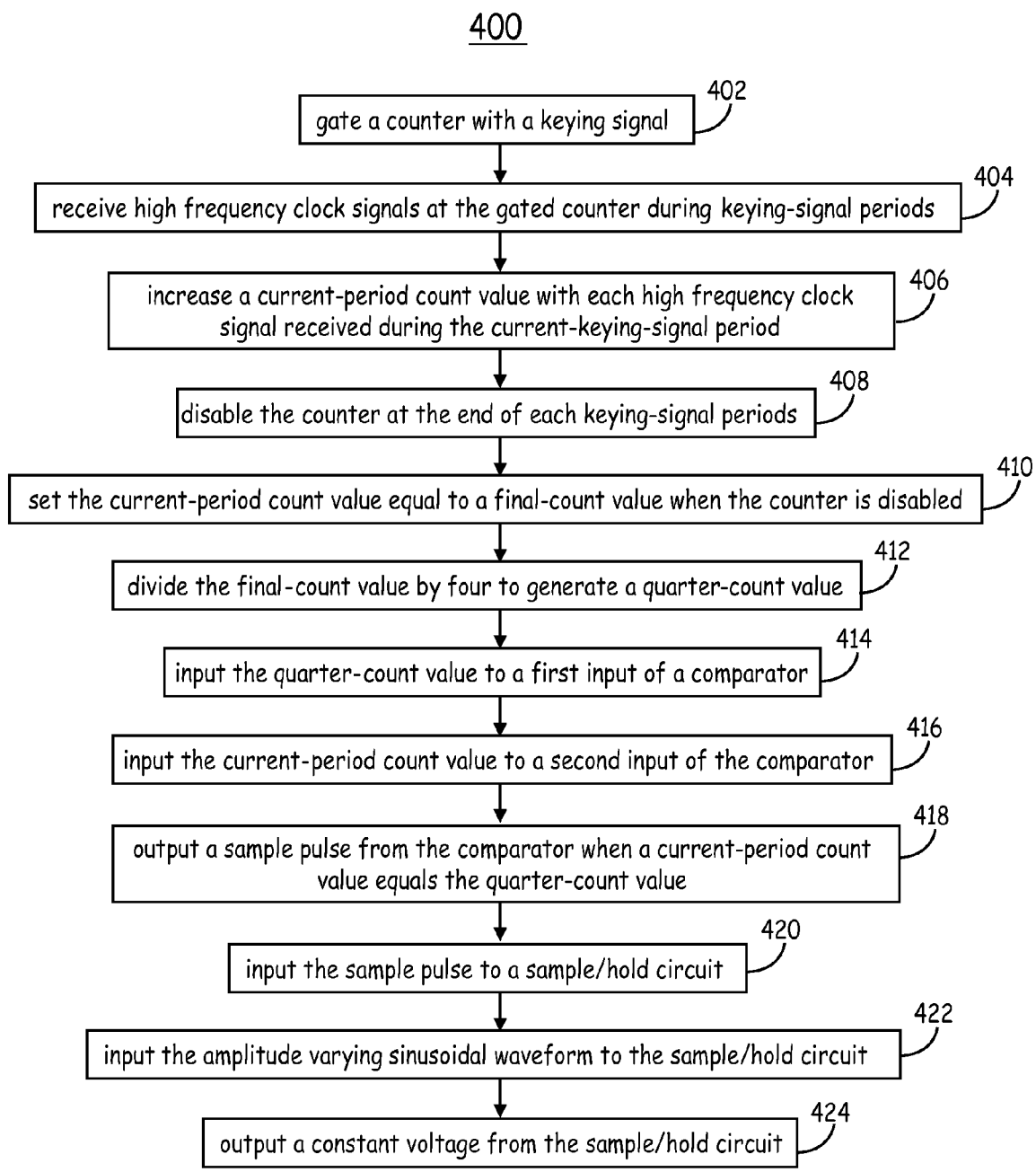
FIG. 4 is a flow diagram of one embodiment of a method of extracting peak information from an amplitude varying sinusoidal waveform output from a sensor in accordance with the present invention.

FIG. 4 is a flow diagram of method 400 of extracting peak information from an amplitude varying sinusoidal waveform 532 output from a sensor 20 and differential receiving amplifier 205. The method 400 is implemented by the sensor peak detection circuit 10 and the quarter cycle waveform detector circuit 100 of FIGS. 1 and 2. The keying signals 500, the high frequency clock signals 560, and the generated sample pulses 550 shown in FIG. 3, as used in the description of the method 400.

A counter 110 is gated with a keying signal 500 having a keying-signal period 510 generated by a sinusoidal waveform 530 (block 402). The keying signal 500 is generated from the sinusoidal waveform 530 that is input to the zero-crossing detector 200 from the generator 30. The sinusoidal waveform 530 is associated with the amplitude varying sinusoidal waveform 532 generated by the sensor 20 and the differential receiving amplifier 205 (FIG. 1). High frequency clock signals 560 are received at the gated counter 110 during keying-signal periods 510 (block 404).

A current-period count value is increased with each $i^{th}$ high frequency clock signal 560-$i$ received during the current-keying-signal period 510-3 (block 406). The incremented number of high frequency clock signals received during each keying-signal period is the current-period count value. The current-period count value is temporarily stored in the second register 120. The current-period count value is also referred to herein as the "first-period count value." The counter 110 is disabled at the end of each keying-signal period 510 (block 408). The current-period count value is set equal to a final-count value when the counter 110 is disabled at the end of the current-keying-signal period 510-3 (block 410). The final-count value is also referred to herein as a "first-final-count value."

The final-count value is divided by four (4) to generate a quarter-count value (block 412). The first register 130 consecutively stores the quarter-count value for each consecutive keying-signal period 510. The quarter-count value equals a fourth (¼) of the final-count value and is shown in FIG. 3 as the number of high frequency cycles 561 in the time segment 562 (also shown as time segment 'A'). The quarter-count value is also referred to herein as a "first-quarter-count value." In this manner, the steps of blocks 408-412 generate a quarter-count value based on the disabling of the counter 110. The counter 110 is cleared when the number of high frequency clock signals received during a keying-signal period is divided by four and the second-period count value is counted starting from zero.

The quarter-count value is input to a first input 141 of a comparator 140 (block 414). In the exemplary case shown in FIG. 3, the first-quarter-count value was generated during the last-keying-signal period 510-2. The current-period count value is input to the second input 142 of the comparator 140 (block 416). The sample pulse 550-3 is output from the output 143 of comparator 140 when the second-period count value equals the first-quarter-count value that was generated during the last-keying-signal period 510-2 (block 418). In this manner, an $i^{th}$ sample pulse 550-$i$ associated with an $i^{th}$ keying-signal period is generated by the quarter cycle waveform detector circuit 100.

If the duration $T_C$ of current-keying-signal period 550-3 is the same as the duration $T_L$ of the last-keying-signal period 550-2, the sample pulse 550-3 is generated at a quarter-wave of the sinusoidal waveform 530. In FIG. 3, this is graphically indicated by the two adjacent time segments A in the keying signals 500(1-4). The sample pulses 550(1-4) that are output from the comparator 140 are aligned to the quarter-cycle of the keying signals 500(1-4).

However, if the duration $T_C$ of current-keying-signal period 550-3 is not the same as the duration $T_L$ of the last-keying-signal period 550-2, the sample pulse 550-3 is generated slightly off from a quarter-wave of the sinusoidal waveform 530 for only one cycle of the sinusoidal waveform 530. An exemplary case is illustrated in FIG. 3.

As shown in FIG. 3, keying-signal period 510-5 differs from the keying-signal period 510-4. If the keying-signal period 510-5 is the current-keying-signal period, also referred to herein as the second keying-signal period 510-5, then the last-keying-signal period is the keying-signal period 510-4, also referred to herein as the first keying-signal period 510-4. The sample pulse 550-5 is not output at exactly the quarter cycle of the keying signal 500-5. In FIG. 3, this is illustrated by the adjacent time segments A and B in the keying signal 500-5. The time segment A does not equal the time segment B. The sample pulse 550-5 output from the comparator 140 is not aligned to the quarter-cycle of the keying signals 500-5. However, in the next-keying-signal period 510-6, the sample pulse 550-6 output from the comparator 140 is aligned to the quarter-cycle of the keying signals 500-6. This is illustrated by the equal time segments C-C in the keying signal 500-6 in FIG. 3. The time segments 2C equal the time segment (A+B). The time segment C is also referred to herein as the time segment 563, which is a quarter-cycle of the keying signals 550-5 and 550-6 that have the new keying-signal periods of duration $T'_{KS}$. Thus, if current-keying-signal period 550-5 differs from the last-keying-signal period 550-4, the associated output sample pulses 550 are adjusted to the quarter-wave of the sinusoidal waveform 530 in the next-keying-signal period 550-6.

As a possible application of the quarter cycle waveform detector, the sample pulse 550 is input to a first input 221 of the sample/hold circuit 220 (block 420). The amplitude varying sinusoidal waveform 532 is input to a second input 222 of the sample/hold circuit 220 (block 422). A constant voltage is output from the sample/hold circuit 220 responsive to the inputting of the sample pulse 550 and the amplitude varying sinusoidal waveform 532 (block 424).

A number of embodiments of the invention defined by the following claims have been described. Nevertheless, it will be understood that various modifications to the described embodiments may be made without departing from the spirit and scope of the claimed invention. Accordingly, other embodiments are within the scope of the following claims.

What is claimed is:

1. A method of extracting peak information from an amplitude varying sinusoidal waveform output from a sensor, the method comprising:
    gating a counter with a keying signal having a keying-signal period generated by a sinusoidal waveform associated with the amplitude varying sinusoidal waveform;
    receiving high frequency clock signals at the gated counter during keying-signal periods, wherein a clock-signal period is much less than the keying-signal period;
    disabling the counter at the end of each keying-signal period;
    generating a quarter-count value based on the disabling; and
    outputting a sample pulse associated with each keying-signal period, wherein if a current-keying-signal period is the same as a last-keying-signal period, the sample pulse is generated at a quarter-wave of the sinusoidal waveform, and
    wherein, if the current-keying-signal period differs from the last-keying-signal period, the associated output sample pulses are adjusted to the quarter-wave of the sinusoidal waveform in the next-keying-signal period.

2. The method of claim 1, wherein generating the quarter-count value based on the disabling, comprises:
    increasing a current-period count value with each high frequency clock signal received during the current-keying-signal period;
    setting the current-period count value equal to a final-count value when the counter is disabled at the end of the current-keying-signal period; and
    dividing the final-count value by four.

3. The method of claim 1, further comprising:
    inputting the quarter-count value to a first input of a comparator;
    inputting the current-period count value to a second input of the comparator; and
    outputting a sample pulse from the comparator when a current-period count value equals the quarter-count value.

4. The method of claim 1, wherein outputting a sample pulse associated with each keying-signal period comprises outputting the sample pulse to a first input of a sample/hold circuit, wherein the sample hold circuit receives the amplitude varying sinusoidal waveform from the sensor at a second input, and wherein the sample/hold circuit outputs a voltage indicative of a polarity and the amplitude of the amplitude varying sinusoidal waveform.

5. The method of claim 1, further comprising:
    temporarily storing the number of high frequency clock signals received during each keying-signal period; and
    storing the quarter-count value.

6. The method of claim 1 further comprising clearing the counter responsive to dividing by four the number of high frequency clock signals received during a keying-signal period.

7. The method of claim 1, wherein a current-keying-signal period equals a last-keying-signal period, the method further comprising generating the keying signal from the sinusoidal waveform having the keying-signal period, wherein the sample pulse output during the current-keying-signal period is aligned to a peak of the amplitude varying sinusoidal waveform output from the sensor.

8. The method of claim 1, wherein the last-keying-signal period is a first keying-signal period, the current-keying-signal period is a second keying-signal period, and wherein receiving high frequency clock signals at the gated counter during keying-signal periods comprises receiving high frequency clock signals at the gated counter during a first keying-signal period and receiving the high frequency clock signals at the gated counter during a second keying-signal period, the method further comprising:
    increasing a first-period count value with each high frequency clock signal received during the first keying-signal period;
    disabling the counter at the end of the first keying-signal period,
    setting the first-period count value equal to a first-final-count value of the first keying-signal period when the counter is disabled;
    generating a first-quarter-count value by dividing the first-final-count value by four;
    inputting the first-quarter-count value to a first input of a comparator; and
    increasing a second-period count value with each high frequency clock signal received during the second keying-signal period; and
    inputting the second-period count value to a second input of the comparator; and
    outputting a sample pulse from the comparator when the second-period count value equals the first-quarter-count value.

9. The method of claim 8, wherein the first keying-signal period equals the second keying-signal period, and wherein the output sample pulse output during the second-keying-signal period is aligned to a peak of the amplitude varying sinusoidal waveform output from the sensor.

10. The method of claim 8, wherein the next-keying-signal period is a third-keying-signal period, wherein the first keying-signal period differs from the second keying-signal period, wherein the third-keying-signal period equals the second-keying-signal period, and wherein the output sample pulse output during a third-keying-signal period is aligned to a peak of the amplitude varying sinusoidal waveform output from the sensor when a third-period count value equals a second-quarter-count value.

11. The method of claim 1, further comprising:
inputting the sample pulse to a sample/hold circuit;
inputting the amplitude varying sinusoidal waveform to the sample/hold circuit; and
outputting a constant voltage from the sample/hold circuit responsive to the inputting of the sample pulse and the amplitude varying sinusoidal waveform.

12. The method of claim 11, further comprising generating the keying signal from the sinusoidal waveform at a zero-crossing detector.

13. A quarter cycle waveform detector circuit comprising:
a counter gated by a keying signal generated from a sinusoidal waveform having a keying-signal period;
a clock generator to provide high frequency clock signals to the counter, wherein current-count values are incremented with each high frequency clock cycle, and wherein a final-count value is set for each associated keying-signal period, the final-count value equaling the number of frequency clock cycles per the associated keying-signal;
a register to consecutively store a quarter-count value for each consecutive keying-signal period, the quarter-count value equaling a fourth of the final-count value; and
a comparator including,
a first input to receive the quarter-count value for a last-keying-signal period,
a second input to receive a current-count value for a current-keying-signal period, and
an output to output a sample pulse when the quarter of the count value in the last-keying-signal period equals the count value in the current-keying-signal period, wherein a sample pulse is generated at a quarter period of the sinusoidal waveform generating the last-keying signal, wherein the circuit adjusts for a change in keying signal frequency within one cycle.

14. The circuit of claim 13, wherein the register is a first register, the circuit further comprising a second register to temporarily store the current-count value for the current-keying-signal period.

15. The quarter cycle waveform detector circuit of claim 13, wherein the keying signal is generated when the sinusoidal waveform is input to a zero-crossing detector,
wherein the sample pulse is input to a first input of a sample/hold circuit,
wherein an amplitude varying sinusoidal waveform associated with the sinusoidal waveform is output from a sensor to a second input of the sample/hold circuit, and
wherein a constant voltage output from the sample/hold circuit is indicative of a polarity and an amplitude of the amplitude varying sinusoidal waveform.

16. The quarter cycle waveform detector circuit of claim 13, wherein the period of the high frequency clock signal is much less than the period of the keying signal.

17. A sensor peak detection circuit comprising:
a sensor to receive a sinusoidal waveform and to output an amplitude varying sinusoidal waveform responsive to the input of the sinusoidal waveform;
a zero crossing detector to receive the sinusoidal waveform and to output a keying signal having a keying-signal period responsive to the input of the sinusoidal waveform;
quarter cycle waveform detector circuit to receive the keying signal received from the zero crossing detector, the quarter cycle waveform detector including,
a counter gated by the keying signal,
a clock generator to provide high frequency clock signals to the counter,
wherein current-count values are incremented with each high frequency clock cycle, and wherein a final-count value is set for each associated keying-signal period, the final-count value equaling the number of frequency clock cycles per the associated keying-signal,
a register to consecutively store a quarter-count value for each consecutive keying-signal period, the quarter-count value equaling a fourth of the final-count value, and
a comparator including,
a first input to receive the quarter-count value for a last-keying-signal period, and
a second input to receive a current-count value for a current keying-signal period; and
a sample/hold circuit to receive output from the comparator and to receive the amplitude varying sinusoidal waveform from the sensor and to output a voltage indicative of a polarity and an amplitude of the amplitude varying sinusoidal waveform.

18. The sensor peak detection circuit of claim 17, further comprising a generator to generate the sinusoidal waveform.

19. The sensor peak detection circuit of claim 17, further comprising a differential receiving amplifier to receive an output from the sensor and to output the amplitude varying sinusoidal waveform to the sample/hold circuit.

20. The sensor peak detection circuit of claim 17, wherein the sensor comprises at least one of a synchro, a resolver, a linearly variable differential transformer, a rotary variable differential transformer, a linear Hall sensor, and a capacitive position sensor.

* * * * *